United States Patent
Yi et al.

(10) Patent No.: US 6,846,710 B2
(45) Date of Patent: Jan. 25, 2005

(54) METHOD FOR MANUFACTURING SELF-ALIGNED BICMOS

(75) Inventors: Sang-don Yi, Seoul (KR); Heon-jong Shin, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/750,281

(22) Filed: Dec. 31, 2003

(65) Prior Publication Data

US 2004/0157387 A1 Aug. 12, 2004

(30) Foreign Application Priority Data

Feb. 7, 2003 (KR) .............................. 10-2003-0007870

(51) Int. Cl.$^7$ ......................................... H01L 21/8238
(52) U.S. Cl. ...................... 438/202; 438/312; 438/361
(58) Field of Search ................................ 438/199–217, 438/309–377

(56) References Cited

U.S. PATENT DOCUMENTS

| 6,265,275 B1 | 7/2001 | Marty et al. ................. 438/309 |
| 6,344,384 B2 | 2/2002 | Arai et al. .................... 438/234 |
| 2003/0132453 A1 * | 7/2003 | Greenberg et al. .......... 257/197 |

FOREIGN PATENT DOCUMENTS

| JP | 2002-16158 | 1/2002 | ....... H01L/21/8249 |
| KR | 01-51482 | 6/2001 | ......... H01L/21/328 |

* cited by examiner

Primary Examiner—H. Jey Tsai
(74) Attorney, Agent, or Firm—Mills & Onello, LLP

(57) ABSTRACT

Provided is a method for manufacturing a self-aligned BiCMOS including a SiGe heterojunction bipolar transistor (HBT) for performing high-frequency operations. In this method, an extrinsic base and a selective ion-implanted collector (SIC) are formed by a self-alignment process.

19 Claims, 7 Drawing Sheets

METHOD FOR MANUFACTURING SELF-ALIGNED BICMOS

CROSS REFERENCES TO RELATED APPLICATIONS

This application claims the priority of Korean Patent Application No. 2003-07870, filed on Feb. 7, 2003, the contents of which are incorporated herein by reference in their entirety.

BACKGROUND OF THE INVENTION

1. Field of the Invention

The present invention relates to a method for manufacturing a heterojunction bipolar transistor (HBT), and more particularly, to a method for manufacturing a BiCMOS by combining a process of manufacturing an HBT and a process of manufacturing a complementary metal oxide semiconductor (CMOS) transistor.

2. Description of the Related Art

Laborious research into high-frequency operation transistors has progressed along with developments in high-speed communications technologies. In recent years, a SiGe HBT has been applied to high-frequency operation transistors. The SiGe HBT is different from a typical bipolar transistor in that a SiGe epitaxial layer forms a base. When SiGe, which has an energy bandgap that is smaller than that of Si, is used as the base of the HBT, current gain and operating speed can be improved. Even if a high-concentration of impurity ions are implanted into the base, current gain is not lowered. Also, base resistance is reduced so as to decrease figure of noise, and operating voltage is reduced to enable low power dissipation. Further, transition frequency $f_T$ and maximum frequency $f_{max}$ can be increased by controlling the content and distribution of Ge in the SiGe. For these reasons, in communications devices or phase-locked loops (PLLs), a SiGe HBT is widely used as a high-frequency operation device in which $f_T$ and $f_{max}$ are 50 GHz or higher.

An HBT is typically combined with a CMOS transistor to constitute a BiCMOS device. A well-known BiCMOS is formed by combining a CMOS transistor and a bipolar transistor on a silicon substrate. Advanced BiCMOS technologies utilize a SiGe HBT in place of a bipolar transistor. SiGe bases are used for high-performance HBTs which process analog signals, while CMOS transistors are used to process digital signals and store data.

A SiGe HBT exhibits the same performance as Group III–V semiconductor compositions and can be fabricated economically using conventional silicon fabrication processes. Also, "system-on-chip" is enabled using a silicon semiconductor process, thus increasing applicability.

However, as fabrication of a SiGe HBT employs a conventional silicon semiconductor process, misalignment may occur during a photolithographic process, thus degrading performance of a transistor. For example, the doping profile or the area of an emitter-base junction or a base-collector junction may vary performance.

Accordingly, self-alignment is required to maintain minimal variation in the performance of a transistor caused by junctions. Self-alignment, which is typically used to form source/drains of CMOS transistors, can be implemented using spacers.

In particular, conventionally, a double poly structure or outer spacers are used to facilitate self-alignment. However, in this case, the area of a transistor may be increased, thus lowering integration density, or dummy spacers may be formed, thus leading to more defects in a fabrication process. To solve the foregoing problems, a method of forming an emitter-base junction using high-pressure oxidation (HiPOX), which can oxidize polysilicon at a low process temperature, was proposed. However, the HiPOX process generates particles, thus lowering yield.

SUMMARY OF THE INVENTION

The present invention provides a method for manufacturing a self-aligned BiCMOS, by which a SiGe HBT can be formed without degradation due to misalignment.

In accordance with an aspect of the present invention, there is provided a method for manufacturing a BiCMOS, which comprises sequentially forming a gate oxide layer and a gate protection polysilicon layer on a first region where a bipolar transistor, which is formed of a collector, a base, and an emitter, will be formed, and on a second region where a MOS transistor, which is formed of a gate and a source/drain, will be formed. The gate protection polysilicon layer and the gate oxide layer are etched at a portion where the emitter will be formed, in the first region, to expose a substrate. Then, a SiGe base layer is epitaxially grown on the exposed substrate. Insulating layers, which have an etch selectivity with respect to each other, are alternately deposited on the SiGe base layer. Next, a polysilicon layer and an oxide layer are sequentially formed on the resultant structure and then the surface of the oxide layer is planarized. The oxide layer, the polysilicon layer, and parts of the insulating layers are etched in the first region, thereby forming an emitter window. Afterwards, a dummy polysilicon pattern is formed in the emitter window. The oxide layer is removed and dummy spacers are formed on the sidewalls of the dummy polysilicon pattern. Impurity ions are implanted into the SiGe base layer using the dummy polysilicon pattern and the dummy spacers as an ion implantation mask, thereby forming an extrinsic base. The dummy spacers, the dummy polysilicon pattern, and the polysilicon layer are removed. Then, impurity ions are implanted into the emitter window using the insulating layers as an ion implantation mask, thereby forming a selective ion-implanted collector (SIC) in the substrate. The insulating layers which remain in the emitter window are etched. Then, an emitter polysilicon is deposited and patterned to form an emitter. Next, the SiGe base layer is patterned in the first region, thereby completing a base. At the same time, the SiGe base layer and the gate protection polysilicon layer are patterned in the second region, thereby forming a gate. After spacers are formed on the sidewalls of the emitter, the base, and the gate, impurity ions are implanted into the second region to form a source/drain.

In one embodiment, before the gate oxide layer and the gate protection polysilicon layer are formed on the first and second regions, a buried collector layer is formed by implanting impurity ions into the first region of the substrate; a collector layer is epitaxially grown on the buried collector layer; a device isolation layer is formed on a portion of the collector layer excluding an active region; and a sub-collector contact is formed in the first region.

In one embodiment, forming the SiGe base layer comprises forming an undoped Si layer as a seed layer and sequentially forming a SiGe layer and a doped SiGe layer on the seed layer.

In one embodiment, wherein the oxide layer is formed using plasma-enhanced chemical vapor deposition and planarized using chemical mechanical polishing.

In one embodiment, forming the dummy polysilicon pattern comprises: forming a polysilicon layer on the oxide layer to completely fill the emitter window; and planarizing the polysilicon layer until the top surface of the oxide layer is exposed and the polysilicon layer remains only in the emitter window.

In one embodiment, the insulating layers are formed by stacking a first oxide layer, a nitride layer, and a second oxide layer on the SiGe base layer.

The emitter window can be formed by etching only the second oxide layer of the insulating layers.

The selective ion-implanted collector can be formed after the nitride layer exposed in the emitter window is etched using the etched second oxide layer as an etch mask.

In one embodiment, the method of the invention further comprises, after the spacers are formed on the sidewalls of the emitter, the base and the gate and the source/drain is formed in the second region, an ohmic contact including silicide is formed by depositing a metal on the substrate.

According to another aspect, the invention is directed to a method for manufacturing a BiCMOS including a bipolar transistor formed of a collector, a base, and an emitter, and a CMOS transistor formed of a gate and a source/drain. In accordance with the method, a SiGe base layer is epitaxially grown on a substrate. An insulating layer is formed on the SiGe base layer. An emitter window is formed by etching the insulating layer to a partial depth. A dummy polysilicon pattern is formed in the emitter window to have the same height as the surface of the insulating layer. The sidewalls of the dummy polysilicon pattern are exposed and dummy spacers are formed on the sidewalls of the dummy polysilicon pattern. An extrinsic base is formed by implanting impurity ions into the SiGe base layer using the dummy polysilicon pattern and the dummy spacers as an ion implantation mask. The dummy spacers and the dummy polysilicon pattern are removed and a selective ion-implanted collector is formed in the substrate by implanting impurity ions into the emitter window using the remaining insulating layer as an ion implantation mask. The SiGe base layer is exposed by etching the remaining insulating layer and an emitter is formed by depositing and patterning an emitter polysilicon. A gate and a source/drain are formed.

In one embodiment, forming the SiGe base layer comprises forming an undoped Si layer as a seed layer and sequentially forming a SiGe layer and a doped SiGe layer on the seed layer.

The insulating layer can be formed by depositing several layers, and the top surface of the insulating layer can be planarized using chemical mechanical polishing.

Forming the dummy polysilicon pattern can include forming a polysilicon layer on the insulating layer so as to completely fill the emitter window and planarizing the polysilicon layer using chemical mechanical polishing until the surface of the insulating layer is exposed and the polysilicon layer remains only in the emitter window.

According to another aspect, the invention is directed to a method for manufacturing a BiCMOS including a first region where a bipolar transistor, which is formed of a collector, a base, and an emitter, will be formed, and a second region where a CMOS transistor, which is formed of a gate and a source/drain, will be formed, the method comprising: (a) sequentially forming a gate oxide layer and a gate protection polysilicon layer on the first region and the second region; (b) exposing a substrate,by etching the gate protection polysilicon layer and the gate oxide layer at a portion where the emitter will be formed, in the first region, and epitaxially growing a SiGe base layer; (c) sequentially forming a first oxide layer, a nitride layer, a second oxide layer, a polysilicon layer, and a third oxide layer on the SiGe base layer and planarizing the surface of the third oxide layer; (d) opening an emitter window by etching the third oxide layer, the polysilicon layer, and the second oxide layer in the first region, and forming a dummy polysilicon pattern in the emitter window to have the same height as the surface of the third oxide layer; (e) removing the third oxide layer and forming dummy spacers on the sidewalls of the dummy polysilicon pattern; (f) forming an extrinsic base by implanting impurity ions into the SiGe base layer using the dummy polysilicon pattern and the dummy spacers as an ion implantation mask; (g) removing the dummy spacers, the dummy polysilicon pattern, and the polysilicon layer, etching the nitride layer using the etched second oxide layer as an etch mask, and forming a selective ion-implanted collector by implanting impurity ions into the emitter window using the second oxide layer and the nitride layer as an ion implantation mask; (h) etching the second oxide layer and the first oxide layer remaining in the emitter window, depositing an emitter polysilicon on the SiGe base layer, and forming an emitter by patterning the emitter polysilicon and the nitride layer; (i) completing a base by patterning the SiGe base layer and the gate protection polysilicon layer in the first region and, at the same time, forming a gate by patterning the SiGe base layer and the gate protection polysilicon layer; and (j) forming spacers on the sidewalls of the emitter, the base, and the gate and forming a source/drain in the second region by implanting impurity ions.

In one embodiment, before step (a) is performed, the method of the invention comprises forming a buried collector layer by implanting impurity ions into the first region of the substrate, epitaxially growing a collector layer on the buried collector layer, forming a device isolation layer on the collector layer excluding an active region, and forming a sub-collector contact in the first region.

Forming the SiGe base layer can include forming an undoped Si layer as a seed layer and sequentially forming a SiGe layer and a doped SiGe layer on the seed layer.

In one embodiment, in step (c), the third oxide layer is formed using plasma-enhanced chemical vapor deposition and planarized using chemical mechanical polishing.

Forming the dummy polysilicon pattern can include forming a polysilicon layer on the third oxide layer to completely fill the emitter window, and planarizing the polysilicon layer until the top surface of the third oxide layer is exposed and the polysilicon layer remains only in the emitter window.

In one embodiment, After step (j) is performed, the method further includes forming an ohmic contact including silicide by depositing a metal on the substrate.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

As described above, maintaining a high yield of high-frequency operation devices without degrading performance is essential to a SiGe HBT BiCMOS process. In the present invention, the following process is employed to stably reproduce emitter-base junctions, and variation of SICs is eliminated to improve reproducibility of base-collector junctions. Also, an extrinsic base, which is required to increase $f_{MAX}$ or reduce figure of noise, is formed in a self-aligned fashion in order to improve process reproducibility. The entire fabrication process is as follows.

Figure 1:
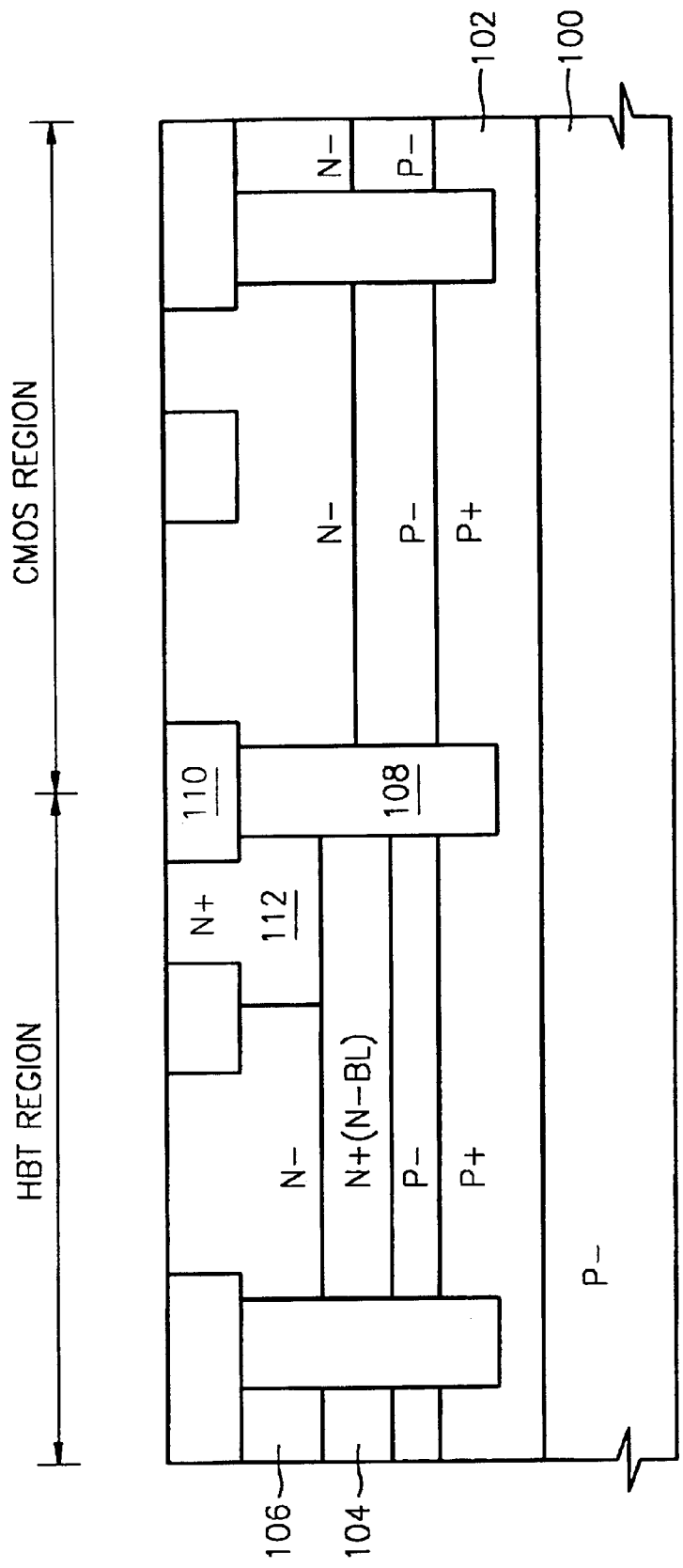
FIG. 1 contains a schematic diagram which illustrates forming a buried collector layer, a collector layer, and a sub-collector contact, and forming a gate oxide layer and a gate protection polysilicon layer, in a method for manufacturing a BiCMOS according to an embodiment of the present invention.

Referring to FIG. 1, a semiconductor substrate 100 including p⁻-type impurity ions, for example, a p⁻-type silicon substrate, is prepared. P⁺-type impurity ions are implanted into the p⁻-type semiconductor substrate 100 to form a p⁺-type region 102. Afterwards, n⁺-type impurity ions, such as As and P, are implanted into an HBT region by using a mask having a predetermined opening. Thus, a buried collector layer 104 (N-BL) is formed. A collector layer 106 is epitaxially grown using atmospheric pressure chemical vapor deposition (APCVD) on the resultant structure where the buried collector layer 104 is formed, and then impurity ions of the buried collector layer 104 diffuse into the collector layer 106. Thus, the collector 106 becomes an n-type epitaxial layer. Here, (−) represents a low concentration on the order of $10^{16}/cm^3$, while (+) represents a high concentration on the order of $10^{19}/cm^3$.

Next, device isolation layers, for example, a polysilicon filled deep trench (PST) 108 and a shallow trench isolation (STI) 110 are formed on the semiconductor substrate 100 excluding an active region of the collector layer 106. These device isolation layers are formed to electrically isolate adjacent transistors. Afterwards, n⁺-type impurity ions are implanted into the collector layer 106 by using a mask having an opening at a portion of the collector layer 106 where a collector electrode will be formed. Thus, an n⁺-type sub-collector contact 112 is formed.

Figure 2:
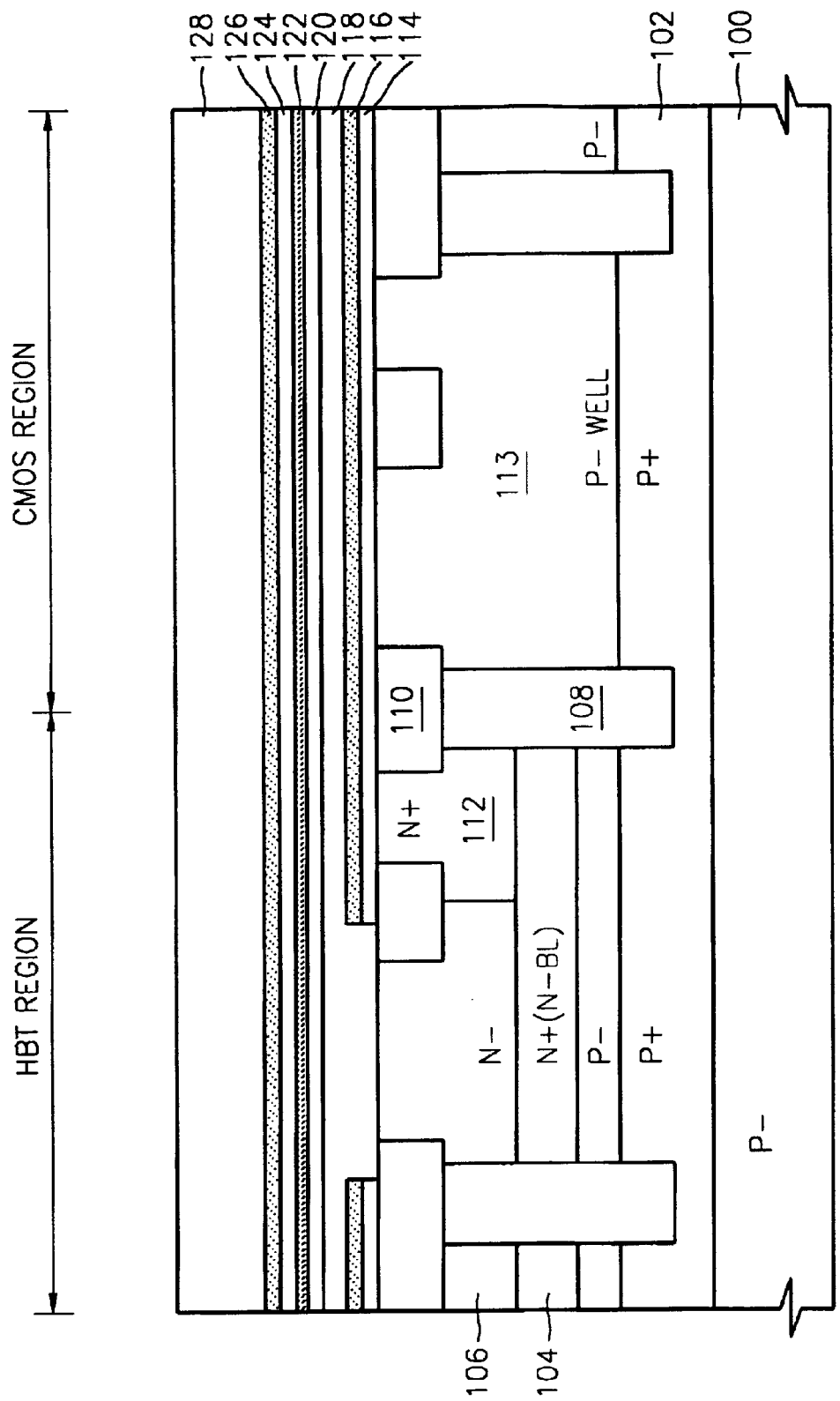
FIG. 2 contains a schematic diagram which illustrates forming a SiGe base layer, alternately depositing insulating layers having an etch selectivity with respect to each other, and sequentially forming a thin polysilicon layer and a thick oxide layer.

As shown in FIG. 2, an n-well (not shown) and a p-well (113) are formed in a CMOS region. Then, if needed, an MIM, MIS, or de-coupling capacitor is formed. As is known, a CMOS transistor is obtained by integrating an n-channel MOS transistor and a p-channel MOS transistor. In the present invention, while only the n-channel MOS transistor will be illustrated and described herein, a p-channel MOS transistor may be formed using opposite conductivity type. Thus, the n-channel MOS transistor and the p-channel MOS transistor can be integrated to easily form a CMOS transistor.

Next, a gate oxide layer 114 is formed on the entire surface of the semiconductor substrate 100. The gate oxide layer 114 can be formed by depositing, for example, a silicon oxide layer, a titanium oxide layer, an aluminium oxide layer, a hafnium oxide layer, or a tantalum oxide layer. Alternatively, a silicon oxide layer can be obtained as the gate oxide layer 114 by thermally oxidizing the semiconductor substrate 100. The gate oxide layer 114 can be formed using conventional deposition methods, such as chemical vapor deposition (CVD), SACVD, low-pressure chemical vapor deposition (LPCVD), and plasma-enhanced chemical vapor deposition (PECVD). Afterwards, a gate protection polysilicon layer 116 is thinly formed on the gate oxide layer 114. For this, polysilicon is deposited using LPCVD at a temperature of 500° C. to 700° C.

A portion of the gate protection polysilicon layer 116, where an emitter will be formed, is removed in the HBT region, and the gate oxide layer 114, which is exposed thereunder, is removed using a wet cleaning process. A known HF diluted solution or a buffered oxide etchant (BOE) can be used to remove the gate oxide layer 114 in a wet cleaning process. Next, a SiGe base layer 118 is epitaxially grown on the exposed collector layer 106. When the SiGe base layer 118 is grown, two-dimensional doping can be performed several times in-situ. Here, the two-dimensional doping comprises (i) growing an epitaxial layer by supplying Si source and Ge source and then (ii) stopping the supply of the sources for a predetermined duration of time and supplying doping source. To complete the SiGe base layer 118, Ge should have a uniform composition of less than 5%, the amounts of C and O should be small at an interface between SiGe base layer 118 and the gate protection polysilicon layer 116, and doping concentration should be correctly adjusted. Preferably, forming the SiGe base layer 118 comprises forming an undoped Si layer as a seed layer and then sequentially forming a SiGe layer and a doped SiGe layer on the seed layer.

Insulating layers having an etch selectivity with respect to each other, for example, a thin first oxide layer 120, a nitride layer 122, and a second oxide layer 124, are alternately deposited on the SiGe base layer 118, and then a thin polysilicon layer 126 is formed on the insulating layers. Next, a third oxide layer 128 is formed using PECVD to a thick thickness, and the surface of the third oxide layer is planarized using chemical mechanical polishing (CMP). Since the insulating layers having an etch selectivity with respect to each other are alternately deposited, subsequent processes can be performed without damaging lower layers.

Figure 3:
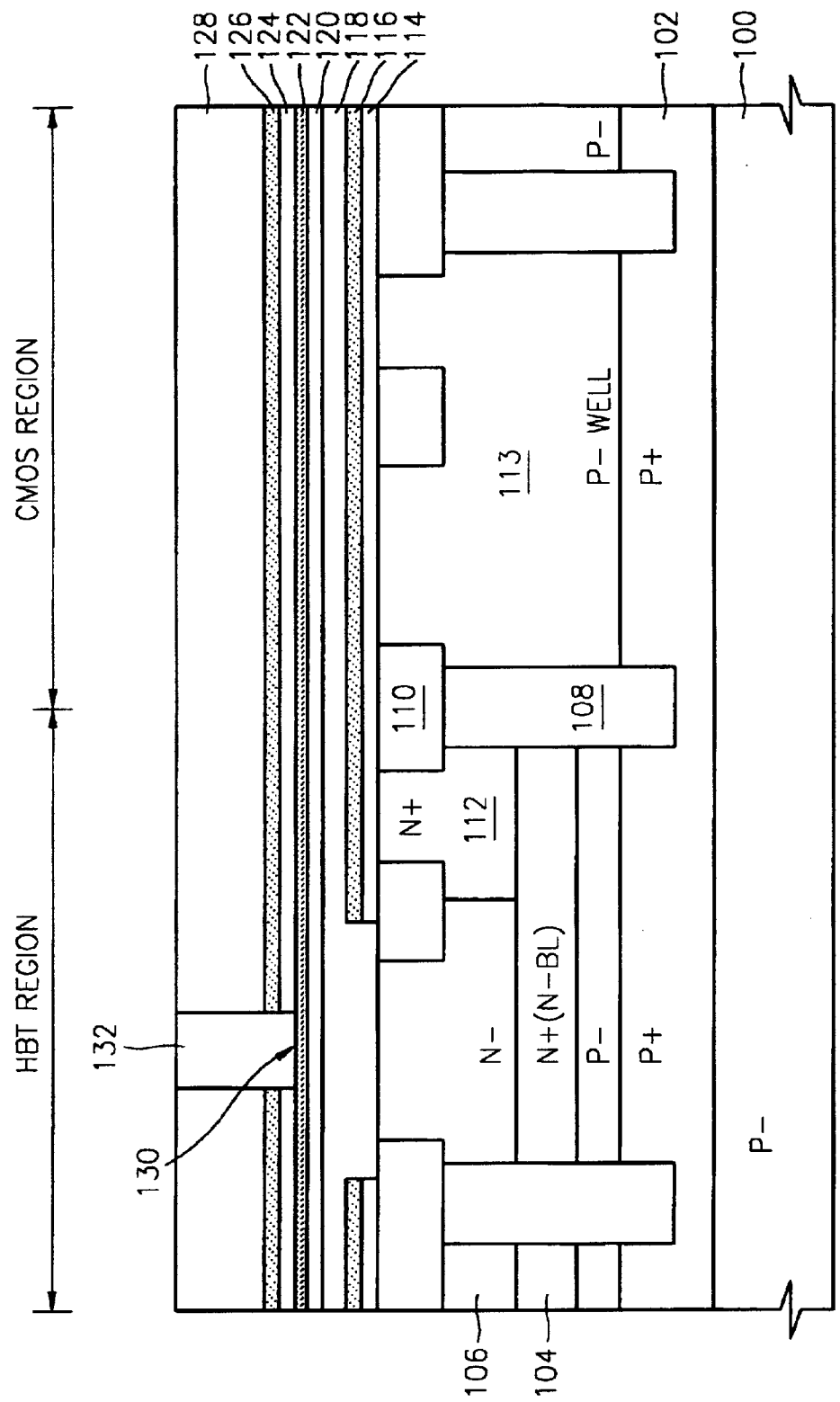
FIG. 3 contains a schematic diagram which illustrates forming a dummy polysilicon pattern in an emitter window.

Referring to FIG. 3, the third oxide layer 128, the polysilicon layer 126, and the second oxide layer 124 are etched to open an emitter window 130 in the HBT region. A dummy polysilicon layer is deposited on the opened emitter window 130 and then planarized using CMP until the top surface of the third oxide layer 128 is exposed. Thus, a dummy polysilicon pattern 132 remains in the emitter window 130.

Figure 4:
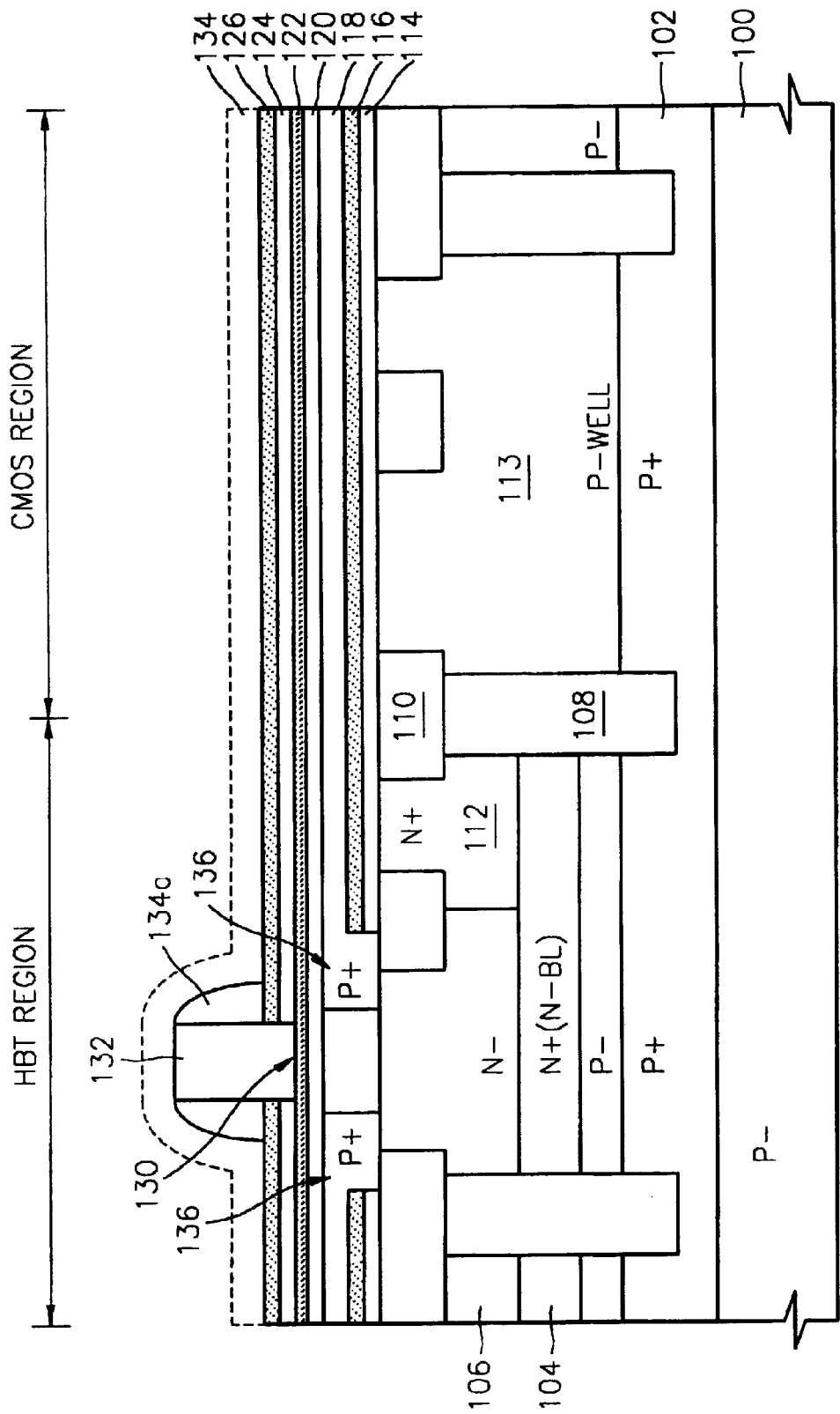
FIG. 4 contains a schematic diagram which illustrates forming a self-aligned extrinsic base.

As shown in FIG. 4, the whole third oxide layer 128 is removed using a wet etch process, and then one of an oxide layer, a nitride layer, and an oxynitride layer are thinly deposited on the dummy polysilicon pattern 132 to form an insulating layer 134 for spacers. The insulating layer 134 for spacers is etched using an etchback process, thereby forming dummy spacers 134a on the sidewalls of the dummy polysilicon pattern 132. Impurity ions are implanted into the SiGe base layer 118 using the dummy polysilicon pattern 132 and the dummy spacers 134a as an ion implantation mask, thereby forming a self-aligned extrinsic base 136. That is, in the present invention, because the doping concentration of the base can be increased due to self-alignment, intrinsic base resistance and parasitic base resistance can be decreased to greatly reduce figure of noise. Also, process reproducibility can be improved, thus increasing $f_{MAX}$.

Figure 5:
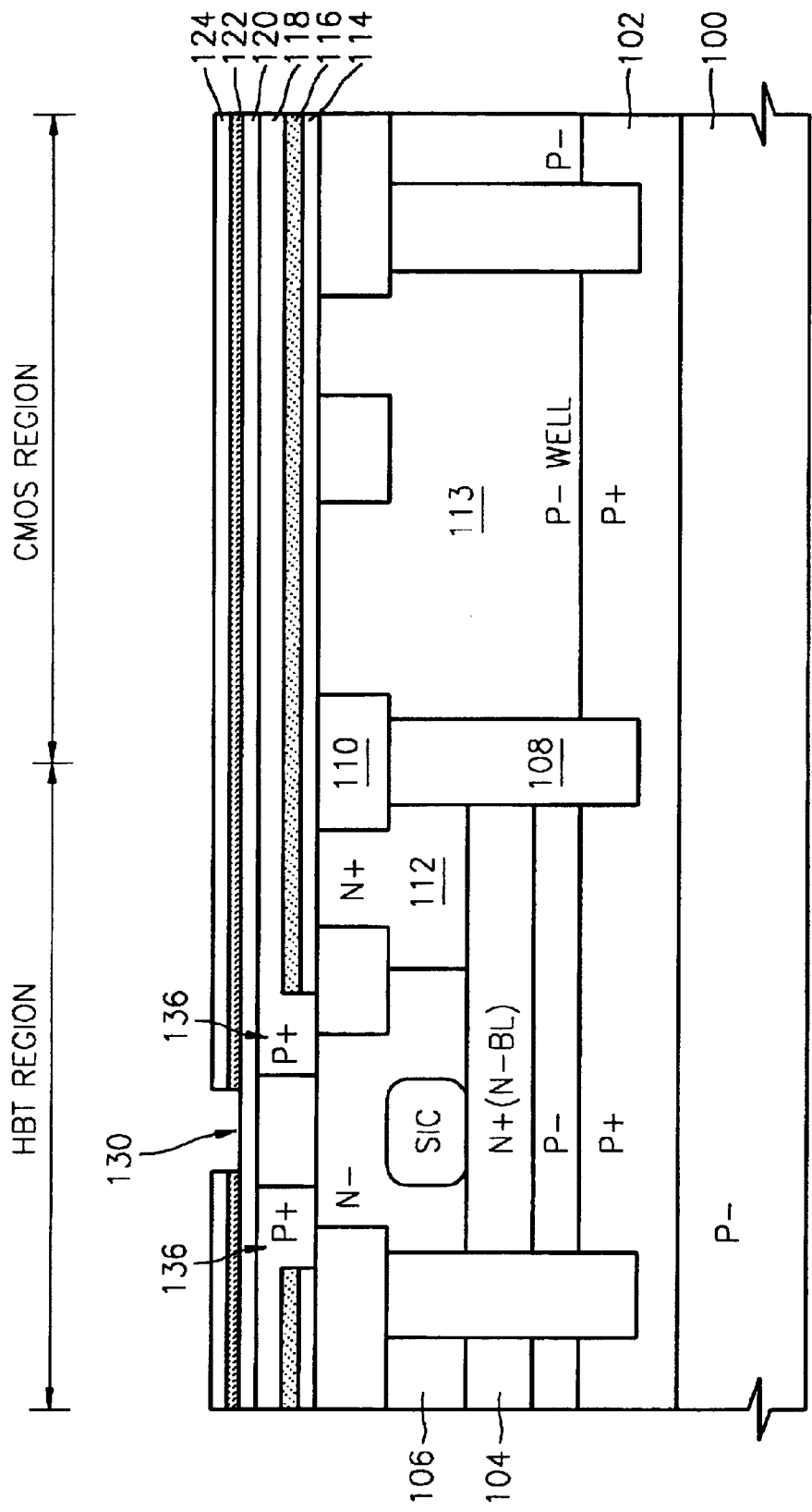
FIG. 5 contains a schematic diagram which illustrates removing the dummy polysilicon pattern.

As shown in FIG. 5, the dummy spacers 134*a* are removed using a wet etch process, and then the dummy polysilicon pattern 132 and the polysilicon layer 126 are removed. The nitride layer 122, which remains in the emitter window 130, is etched using the etched second oxide layer 124 as an etch mask.

Impurity ions are implanted into the emitter window 130 to form an SIC. In the present invention, the ion implantation process is carried out in a self-aligned manner using the second oxide layer 124 and the nitride layer 122 as an ion implantation mask. This enables variation of the SIC to be removed in every process, thus improving reproducibility of base-collector junctions.

Figure 6:
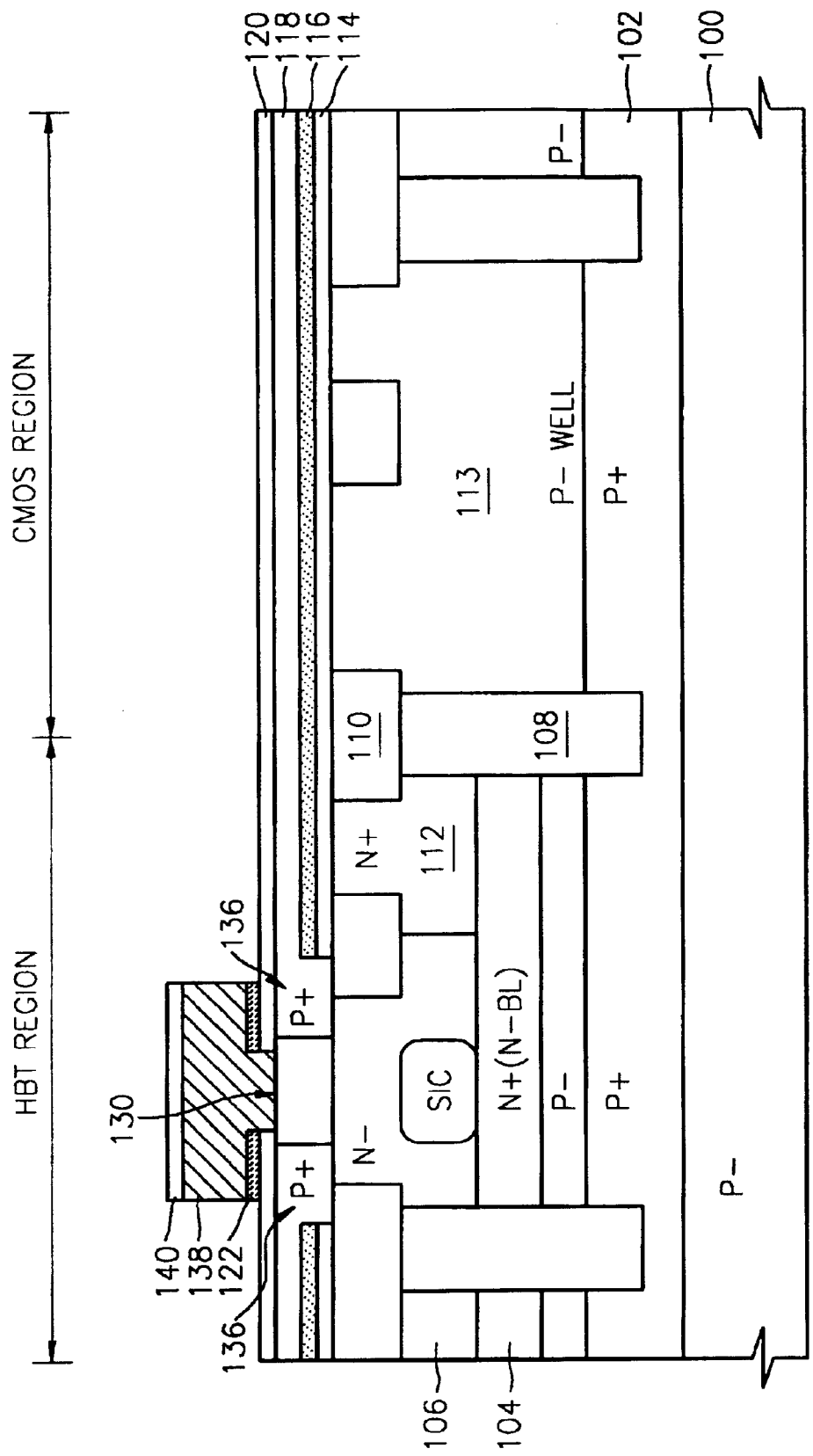
FIG. 6 contains a schematic diagram which illustrates forming a selective ion-implanted collector (SIC) in the emitter window and patterning an emitter polysilicon.

Referring to FIG. 6, the first oxide layer 120 is removed in the emitter window 130 to expose the SiGe base layer 118. An emitter polysilicon 138 and an anti-reflection layer 140 are sequentially deposited on the exposed SiGe base layer 118, and emitter impurity ions are implanted into the resultant structure. Here, if impurity ions are implanted in-situ during deposition of the emitter polysilicon 138, the ion implantation process may be omitted. Afterwards, the emitter polysilicon 138 and the nitride layer 122 are patterned in the shape of an emitter.

Figure 7:
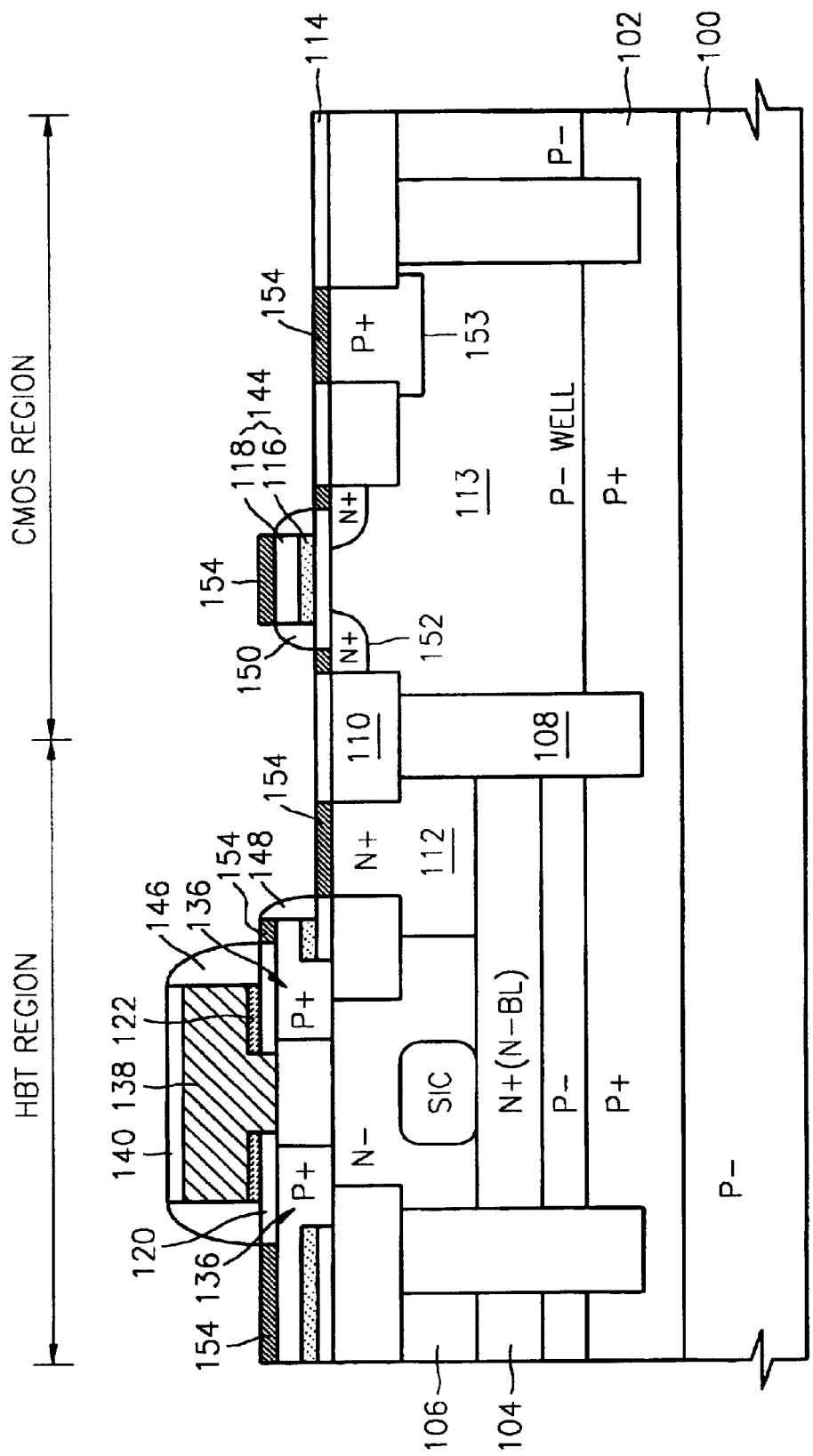
FIG. 7 contains a schematic diagram which illustrates forming a CMOS transistor.

As shown in FIG. 7, a SiGe base layer 118 and a gate protection polysilicon layer 116 are patterned in the HBT region to complete a base. At the same time, the SiGe base layer 118 and the gate protection polysilicon layer 116 are patterned in the CMOS region to complete a gate 144. A reoxidation (Gpox) process is selectively carried out. As is known, when the reoxidation process is performed, a thermal oxide layer (not shown) is formed on the exposed conductive layer, i.e., the gate 144. As a result, etching damage and residue can be removed and a reliable gate oxide layer 114 can be obtained. After the reoxidation process is carried out, spacers 146, 148, and 150 are formed on the sidewalls of the emitter polysilicon 138, the extrinsic base 136, and the gate 144, respectively. As is known, formation of the spacers 146, 148, and 150 comprises depositing one of a nitride layer, an oxide layer, and an oxynitride layer, and etching the deposited layer using an etchback process.

Impurity ions are implanted into the CMOS region using an appropriate mask, thereby forming a source/drain 152. A substrate contact 153 also is formed using an ion implantation process. Next, the first oxide layer 120 and the gate oxide layer 114 are appropriately etched in order to perform a salicide process, by which a suicide process is applied to a desired contact portion. Here, the spacers 146, 148, and 150 may be used as a mask. After contact portions, e.g., the extrinsic base 136, the sub-collector contact 112, the source/drain 152, the gate 144, and an upper portion of the substrate contact 153, are opened, a silicide layer 154 is formed using titanium, cobalt, or nickel. As a result, an ohmic contact is obtained, thus reducing contact resistance and base parasitic resistance.

As described above, according to the present invention, since an SIC and an extrinsic base are formed by a self-alignment process, there is hardly any variation in the parasitic capacitance of a collector-base junction. Thus, process reproducibility can be secured and stable devices can be obtained. Without causing misalignment, $f_T$ and $f_{max}$ of transistors can be increased to obtain high-speed and high-frequency operation devices.

The dummy spacers, which are used for a self-alignment process, are removed later so as not to increase the area of the transistor. As a HiPOX process is not used, yield reduction due to particles does not occur. Accordingly, a BiCMOS can be manufactured by forming a self-aligned SiGe HBT without causing misalignment. Further, the process is simple, thus reducing manufacturing cost.

While the present invention has been particularly shown and described with reference to a preferred embodiment thereof, it will be understood by those of ordinary skill in the art that various changes in form and details may be made therein without departing from the spirit and scope of the present invention as defined by the appended claims.

What is claimed is:

1. A method for manufacturing a BiCMOS including a bipolar transistor formed of a collector, a base, and an emitter, and a CMOS transistor formed of a gate and a source/drain, the method comprising:

epitaxially growing a SiGe base layer on a substrate;

forming an insulating layer on the SiGe base layer;

forming an emitter window by etching the insulating layer to a partial depth;

forming a dummy polysilicon pattern in the emitter window to have the same height as the surface of the insulating layer;

exposing the sidewalls of the dummy polysilicon pattern and forming dummy spacers on the sidewalls of the dummy polysilicon pattern;

forming an extrinsic base by implanting impurity ions into the SiGe base layer using the dummy polysilicon pattern and the dummy spacers as an ion implantation mask;

removing the dummy spacers and the dummy polysilicon pattern and forming a selective ion-implanted collector in the substrate by implanting impurity ions into the emitter window using the remaining insulating layer as an ion implantation mask;

exposing the SiGe base layer by etching the remaining insulating layer and forming an emitter by depositing and patterning an emitter polysilicon; and forming a gate and a source/drain.

2. The method of claim 1, wherein forming the SiGe base layer comprises forming an undoped Si layer as a seed layer and sequentially forming a SiGe layer and a doped SiGe layer on the seed layer.

3. The method of claim 1, wherein the insulating layer is formed by depositing several layers, and the top surface of the insulating layer is planarized using chemical mechanical polishing.

4. The method of claim 1, wherein forming the dummy polysilicon pattern comprises:

forming a polysilicon layer on the insulating layer so as to completely fill the emitter window; and planarizing the polysilicon layer using chemical mechanical polishing until the surface of the insulating layer is exposed and the polysilicon layer remains only in the emitter window.

5. A method for manufacturing a BiCMOS including a first region where a bipolar transistor, which is formed of a collector, a base, and an emitter, will be formed, and a second region where a CMOS transistor, which is formed of a gate and a source/drain, will be formed, the method comprising:

(a) sequentially forming a gate oxide layer and a gate protection polysilicon layer on the first region and the second region;

(b) etching the gate protection polysilicon layer and the gate oxide layer at a portion where the emitter will be formed, in the first region, until a substrate is exposed, and epitaxially growing a SiGe base layer on the exposed substrate;

(c) alternately depositing insulating layers which have an etch selectivity with respect to each other, on the SiGe base layer, sequentially forming a polysilicon layer and an oxide layer, and planarizing the surface of the oxide layer;

(d) forming an emitter window by etching the oxide layer, the polysilicon layer, and parts of the insulating layers in the first region, and forming a dummy polysilicon pattern in the emitter window;

(e) removing the oxide layer and forming dummy spacers on the sidewalls of the dummy polysilicon pattern;

(f) forming an extrinsic base in the SiGe base layer by implanting impurity ions using the dummy polysilicon pattern and the dummy spacers as an ion implantation mask;

(g) removing the dummy spacers, the dummy polysilicon pattern, and the polysilicon layer, and forming a selective ion-implanted collector in the substrate by implanting impurity ions using the insulating layers as an ion implantation mask;

(h) etching the insulating layers remaining in the emitter window and forming an emitter by depositing and patterning an emitter polysilicon;

(i) completing a base by patterning the SiGe base layer in the first region and, at the same time, forming a gate by patterning the SiGe base layer and the gate protection polysilicon in the second region; and (j) forming spacers on the sidewalls of the emitter, the base, and the gate and forming a source/drain in the second region by implanting impurity ions.

6. The method of claim 5, before step (a) is performed, further comprising:

forming a buried collector layer by implanting impurity ions into the first region of the substrate;

epitaxially growing a collector layer on the buried collector layer;

forming a device isolation layer on a portion of the collector layer excluding an active region; and forming a sub-collector contact in the first region.

7. The method of claim 5, wherein forming the SiGe base layer comprises forming an undoped Si layer as a seed layer and sequentially forming a SiGe layer and a doped SiGe layer on the seed layer.

8. The method of claim 5, wherein in step (c), the oxide layer is formed using plasma-enhanced chemical vapor deposition and planarized using chemical mechanical polishing.

9. The method of claim 5, wherein forming the dummy polysilicon pattern comprises:

forming a polysilicon layer on the oxide layer to completely fill the emitter window; and planarizing the polysilicon layer until the top surface of the oxide layer is exposed and the polysilicon layer remains only in the emitter window.

10. The method of claim 5, wherein in step (c), the insulating layers are formed by stacking a first oxide layer, a nitride layer, and a second oxide layer on the SiGe base layer.

11. The method of claim 10, wherein in step (d), the emitter window is formed by etching only the second oxide layer of the insulating layers.

12. The method of claim 11, wherein in step (g), the selective ion-implanted collector is formed after the nitride layer exposed in the emitter window is etched using the etched second oxide layer as an etch mask.

13. The method of claim 5, after step (j) is performed, further comprising forming an ohmic contact including silicide by depositing a metal on the substrate.

14. A method for manufacturing a BiCMOS including a first region where a bipolar transistor, which is formed of a collector, a base, and an emitter, will be formed, and a second region where a CMOS transistor, which is formed of a gate and a source/drain, will be formed, the method comprising:

(a) sequentially forming a gate oxide layer and a gate protection polysilicon layer on the first region and the second region;

(b) exposing a substrate by etching the gate protection polysilicon layer and the gate oxide layer at a portion where the emitter will be formed, in the first region, and epitaxially growing a SiGe base layer;

(c) sequentially forming a first oxide layer, a nitride layer, a second oxide layer, a polysilicon layer, and a third oxide layer on the SiGe base layer and planarizing the surface of the third oxide layer;

(d) opening an emitter window by etching the third oxide layer, the polysilicon layer, and the second oxide layer in the first region, and forming a dummy polysilicon pattern in the emitter window to have the same height as the surface of the third oxide layer;

(e) removing the third oxide layer and forming dummy spacers on the sidewalls of the dummy polysilicon pattern;

(f) forming an extrinsic base by implanting impurity ions into the SiGe base layer using the dummy polysilicon pattern and the dummy spacers as an ion implantation mask;

(g) removing the dummy spacers, the dummy polysilicon pattern, and the polysilicon layer, etching the nitride layer using the etched second oxide layer as an etch mask, and forming a selective ion-implanted collector by implanting impurity ions into the emitter window using the second oxide layer and the nitride layer as an ion implantation mask;

(h) etching the second oxide layer and the first oxide layer remaining in the emitter window, depositing an emitter polysilicon on the SiGe base layer, and forming an emitter by patterning the emitter polysilicon and the nitride layer;

(i) completing a base by patterning the SiGe base layer and the gate protection polysilicon layer in the first region and, at the same time, forming a gate by patterning the SiGe base layer and the gate protection polysilicon layer; and (j) forming spacers on the sidewalls of the emitter, the base, and the gate and forming a source/drain in the second region by implanting impurity ions.

15. The method of claim 14, before step (a) is performed, further comprising:

forming a buried collector layer by implanting impurity ions into the first region of the substrate;

epitaxially growing a collector layer on the buried collector layer;

forming a device isolation layer on the collector layer excluding an active region; and forming a sub-collector contact in the first region.

16. The method of claim 14, wherein forming the SiGe base layer comprises forming an undoped Si layer as a seed layer and sequentially forming a SiGe layer and a doped SiGe layer on the seed layer.

17. The method of claim 14, wherein in step (c), the third oxide layer is formed using plasma-enhanced chemical vapor deposition and planarized using chemical mechanical polishing.

18. The method of claim 14, wherein forming the dummy polysilicon pattern comprises:

forming a polysilicon layer on the third oxide layer to completely fill the emitter window; and planarizing the polysilicon layer until the top surface of the third oxide layer is exposed and the polysilicon layer remains only in the emitter window.

19. The method of claim 14, after step (j) is performed, further comprising forming an ohmic contact including silicide by depositing a metal on the substrate.

* * * * *